United States Patent [19]
Takahashi et al.

[11] Patent Number: 5,981,641
[45] Date of Patent: Nov. 9, 1999

[54] HEAT CONDUCTIVE SILICONE COMPOSITION, HEAT CONDUCTIVE MATERIAL AND HEAT CONDUCTIVE SILICONE GREASE

[75] Inventors: Takayuki Takahashi; Masahiko Minemura; Takashi Ohkawara, all of Gunma-Ken, Japan

[73] Assignee: Shin-Etsu Chemical Co., Ltd., Japan

[21] Appl. No.: 08/908,813

[22] Filed: Aug. 8, 1997

[30] Foreign Application Priority Data

Aug. 9, 1996 [JP] Japan .................................. 8-227878
Jul. 16, 1997 [JP] Japan .................................. 8-208464

[51] Int. Cl.$^6$ ...................................................... C08L 83/00
[52] U.S. Cl. .......................... 524/428; 524/432; 524/437; 524/786; 524/783; 508/172
[58] Field of Search ................................ 524/428, 432, 524/437, 786, 783; 508/172

[56] References Cited

U.S. PATENT DOCUMENTS 4,265,775   5/1981   Aakalu et al. .
5,011,870   4/1991   Peterson .
5,100,568   3/1992   Takahashi et al. .
5,227,081   7/1993   Sawa et al. ............................... 252/28

FOREIGN PATENT DOCUMENTS 0481758   10/1990   European Pat. Off. .

OTHER PUBLICATIONS

Patent Abstracts of Japan, vol. 013, No. 529 (C–658), Nov. 27, 1989.

*Primary Examiner*—Melvyn I. Marquis
*Assistant Examiner*—Mark W. Milstead
*Attorney, Agent, or Firm*—Millen, White, Zelano & Branigan, P.C.

[57] ABSTRACT

Provided are a thermally conductive silicone composition, a thermally conductive material and a thermally conductive silicone grease, wherein a liquid silicone, an aluminum nitride powder and a zinc oxide powder are comprised, and wherein the total amount of those powders are from 500 to 1,000 parts by weight per 100 parts by weight of the liquid silicone and the ratio of the zinc oxide powder to the sum total of the aluminum nitride powder and the zinc oxide powder is from 0.05 to 0.5 by weight.

20 Claims, 1 Drawing Sheet

HEAT CONDUCTIVE SILICONE COMPOSITION, HEAT CONDUCTIVE MATERIAL AND HEAT CONDUCTIVE SILICONE GREASE

FIELD OF THE INVENTION

The present invention relates to a thermally conductive material which comprises a silicone composition and, more particularly, to a thermally conductive material, such as a thermally conductive grease, which comprises a silicone composition and has an excellent thermal conductivity well-suited for heat reduction of electronic parts.

BACKGROUND OF THE INVENTION

Most of electric and electronic appliances generate heat while they are used, so that the removal of generated heat therefrom is necessary for their normal operation. With the intention of removing the generated heat from those appliances, many means have been proposed. For instance, in miniature electronic parts, especially electronic devices provided with integrated circuits, thermally conductive materials, such as a thermally conductive grease and a thermally conductive sheet [Japanese Tokkai Sho 56-28264 (U.S. Pat. No. 4,265,775) and Japanese Tokkai Sho 61-157587, wherein the term "Tokkai" means an "unexamined published patent application], have been used as such means.

In general, such an electronic device comprises integrated circuits and cap parts for protecting them, and a thermally conductive material is applied so as to contact directly with both of the circuit element and the heat-reducing part, or indirectly therewith via certain materials. Thus, the heat generated from integrated circuit chips during operation is transmitted in the thermally conductive material to be transferred directly or indirectly to the heat-reducing part, and further radiated therefrom. The rough sectional view of such an electronic device, wherein a thermally conductive material is used, is shown in FIG. 1.

As the aforementioned thermally conductive material, a heat-reducing grease of the type which uses a silicone oil as a base material and a zinc oxide or alumina powder as a thickener is already known [Japanese Tokko Sho 52-33272 and Japanese Tokko Sho 59-52195 (U.S. Pat. No. 3,885,984), wherein the term "Tokko" means an "examined patent publication"). In recent years, aluminum nitride has been developed as a thickener which enables further improvement of thermal conductivity (as disclosed, e.g., in Japanese Tokkai Sho 52-125506).

Since aluminum nitride has insufficient oil-holding power, however, its content in a silicone oil is limited to a very narrow range, specifically the order of 50–95 parts by weight per 100 parts by weight of silicone oil. Accordingly, the contribution of aluminum nitride to improvement in the thermal conductivity of silicone grease is not great although the aluminum nitride itself has a good thermal conductivity.

In addition, Japanese Tokkai Sho 56-28264 discloses the thixotropic thermally conductive material comprising a liquid organosilicone carrier, silica fibers in an amount required for effectively preventing the liquid carrier from exuding, and at least one thickener selected from among dendrite-form zinc oxide, flake-shaped aluminum nitride and flake-shaped boron nitride. In this thermally conductive material also, the enhanced oil-holding power is secured by incorporating spherical silica fibers as an essential component; as a result, the content of an aluminum nitride powder is inevitably lowered. Therefore, a sufficient improvement in thermal conductivity cannot be expected in this case also.

The drawback as described above can be mitigated by combining a particular organopolysiloxane with spherical grains of hexagonal aluminum nitride to enable the incorporation of a very large amount of aluminum nitride in the silicone oil (Japanese Tokkai Hei 2-153995).

When the aluminum nitride grains are coarse in size, however, gaps are formed among the grains because aluminum nitride is a very hard material having Mohs's hardness of 7–9. Accordingly, even if the aluminum nitride powder is added in an increased amount with the intention of heightening the thermal conductivity, the thermal conductivity attained is below expectation, namely of the order of $5.5 \times 10^{-3}$ cal/cm·sec·° C., and so a satisfactory result has not been achieved as yet.

As a means to solve the above problem, a method of using a fine aluminum nitride powder and a coarse aluminum nitride powder in combination can be adopted [Japanese Tokkai Hei 3-14873 (U.S. Pat. No. 5,011,870)]. In this case, however, the grease prepared, although the thermal conductivity thereof is improved, is low in consistency (in other words, hard) and poor in dispensation suitability. Therefore, such a means is undesirable from a practical point of view.

Thus, a method of using an organopolysiloxane of the kind which can hold a large amount of metallic powder in combination with at least one metallic powder selected from the group consisting of ZnO, $Al_2O_3$, AlN and $Si_3N_4$ was also proposed (e.g., in Japanese Tokkai Hei 2-212556 and Japanese Tokkai Hei 3-162493). However, satisfactory heat-reducing grease is not yet realized by such combinations.

SUMMARY OF THE INVENTION

As a result of our intensive studies to further improve upon the dispensation suitability and the thermal conductivity, it has been found that a thermally conductive material having excellent dispensation suitability as well as high thermal conductivity can be obtained by the combined used of an organopolysiloxane, an aluminum nitride powder and a zinc oxide powder, thereby achieving the present invention.

Therefore, a first object of the present invention is to provide a thermally conductive silicone composition suitable for the removal of heat generated from electronic devices during their operation.

A second object of the present invention is to provide a thermally conductive material useful for the removal of heat generated from electronic devices during their operation.

A third object of the present invention is to provide a silicone grease having excellent dispensation suitability and high thermal conductivity which is useful for the removal of heat generated from electronic devices during their operation.

A fourth object of the present invention is to provide a silicone grease for heat reduction which has excellent dispensation suitability and high thermal conductivity and can be charged in a device equipped with an extruding means to enable the quantitative application of the silicone grease.

The above-described objects of the present invention are attained with a thermally conductive silicone composition comprising a liquid silicone and a heat conductive agent, with the thermally conductive filler comprising an aluminum nitride powder and a zinc oxide powder, wherein the aluminum nitride powder and the zinc oxide powder are incorporated in a total amount from 500 to 1,000 parts by weight per 100 parts by weight of the liquid silicone, and wherein the ratio of the zinc oxide powder to the sum total of the aluminum nitride powder and the zinc oxide powder is from 0.05 to 0.5 by weight; a thermally conductive material comprising a liquid silicone and a thermally conductive filler, with the conductive agent comprising an aluminum nitride powder and a zinc oxide powder, and with the material having a thermal conductivity of at least $6.0 \times 10^{-3}$ cal/cm·sec·° C., wherein the aluminum nitride powder and the zinc oxide powder are incorporated in a total amount of from 500 to 1,000 parts by weight per 100 parts by weight of the liquid silicone; and a thermally conductive silicone grease comprising a liquid silicone and a thermally conductive filler, with the thermally conductive filler comprising an aluminum nitride powder and a zinc oxide powder, and with the grease having a thermal conductivity of at least $6.0 \times 10^{-3}$ cal/cm·sec·° C. and a consistency of from 200 to 400, wherein the aluminum nitride powder and the zinc oxide powder are incorporated in a total amount of from 500 to 1,000 parts by weight per 100 parts by weight of the liquid silicone.

DETAILED DESCRIPTION OF THE INVENTION

Figure 1:
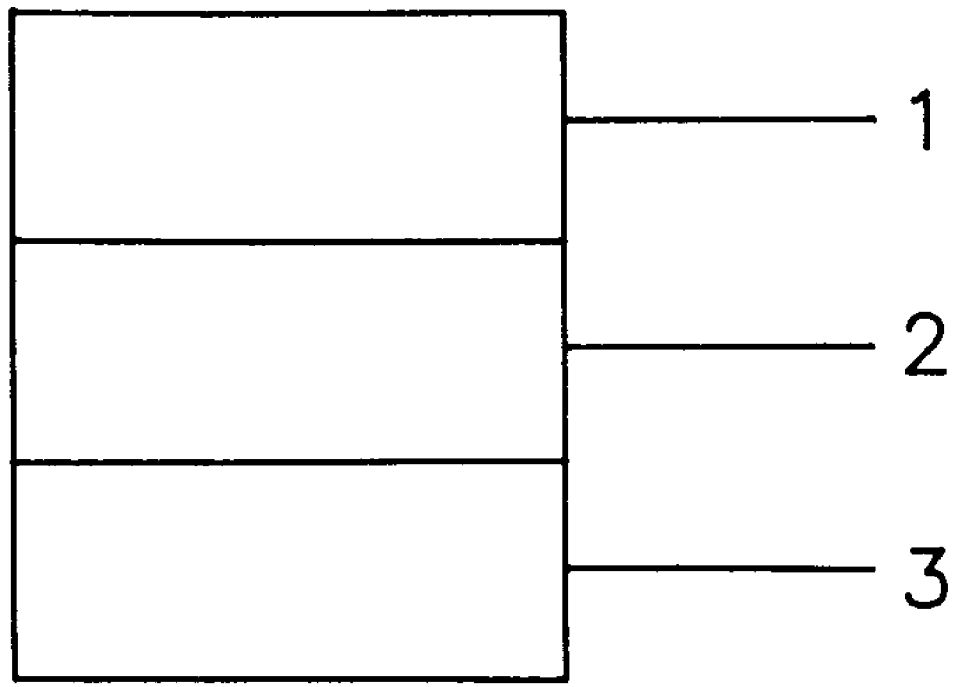
FIG. 1 is a rough sectional view of an electronic device which is provided with a thermally conductive silicone grease for the purpose of removing the heat generated in the device, wherein the FIG. 1 denotes a heat-reducing part, the FIG. 2 denotes a thermally conductive silicone grease and the FIG. 3 denotes an electronic device which generates heat during operation.

The liquid silicone used in the present invention can be properly selected from known silicones which are liquid at room temperature, such as organopolysiloxanes, organopolysilalkylenes, organopolysilanes and copolymers thereof. From the viewpoint of ensuring heat resistance, stability and electric insulation, however, it is desirable to use as the present liquid silicone an organopolysiloxane, particularly an organopolysiloxane represented by formula $R_aSiO_{(4-a)/2}$, wherein R groups may be the same or different and each of them represents a monovalent organic group, and a is a number of 1.8–2.3.

Specific examples of a monovalent organic group as R include monovalent unsubstituted or substituted hydrocarbon groups having 1 to 30 carbon atoms, such as alkyl groups (e.g., methyl, ethyl, propyl, butyl, pentyl, hexyl, octyl, decyl, dodecyl, tetradecyl, hexadecyl, octadecyl, etc.), cycloalkyl groups (e.g., cyclohexyl, etc.), alkenyl groups (e.g., vinyl, allyl, etc.), aryl groups (e.g., phenyl, naphthyl, tolyl, etc.), and groups formed by substituting halogen atom(s), cyano group(s), hydroxyl group(s) or/and so on for part or all of the hydrogen atoms attached to carbon atoms present in the above-recited groups (e.g., chloromethyl, 3,3,3-trifluoropropyl, cyanopropyl, phenol, hindered phenol, etc.); and organic functional groups, such as an organic group having an amino group, an organic group having a polyether group and an organic group having an epoxy group. Of these organic groups, a methyl group, a phenyl and an alkyl groups having 6 to 14 carbon atoms are preferred over the others.

It is desirable in respect of grease characteristics that the viscosity of the foregoing organopolysiloxane be within the range of 50 to 500,000 cs, particularly 50 to 300,000 cs, at 25° C. When the viscosity is below 50 cs at 25° C., the grease obtained shows a strong tendency to oil separation; while, when it is above 500,000 cs at 25° C., the grease prepared is so high in consistency that it cannot possibly be dispensed to a substrate in a satisfactory condition.

The organopolysiloxane used in the present invention can have any of linear, branched and cyclic structures, and it is not necessarily a single compound, but it can be a mixture of two or more of different compounds. As mentioned above, a is a number of 1.8–2.3, but it is preferably within the range of 1.9 to 2.1. This is because the organopolysiloxane can have a linear structure or a structure near thereto when a is in the foregoing range.

Specific examples of such an organopolysiloxane include dimethylpolysiloxane, diethylpolysiloxane, methylphenylpolysiloxane, dimethylsiloxane-diphenylsiloxane copolymer and alkyl-modified methylpolysiloxanes. Of these polysiloxanes, the homo- or co-polymers which are blocked by trimethylsilyl group or dimethylhydrosilyl group at both molecular ends and have as their constitutional units one or two kinds of organosiloxanes selected from among dimethylsiloxane, alkylmethylsiloxanes, methylphenylsiloxane and diphenylsiloxane are preferred over the others.

More specifically, those organopolysiloxanes are represented by the following formula (I):

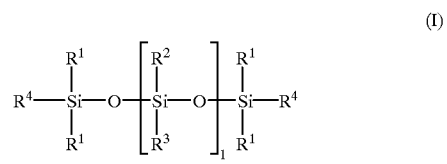

wherein $R^1$ is a group selected from the class consisting of monovalent unsubstituted or substituted hydrocarbon groups having 1 to 30 carbon atoms, including alkyl groups, such as methyl, ethyl, propyl, butyl, amyl and octyl groups, alkenyl groups, such as vinyl and allyl groups, aryl groups, such as phenyl and tolyl groups, and groups formed by substituting halogen atom(s), cyano group(s), hydroxyl group(s) or/and so on for part or all of the hydrogen atoms attached to carbon atoms present in the above-recited groups, such as chloromethyl, 3,3,3-trifluoropropyl, cyanopropyl, phenol and hindered phenol groups; $R^2$ and $R^3$ are the same or different, and each of them is the same monovalent hydrocarbon group as $R^1$ or a monovalent organic functional group selected from among amino group-containing organic groups, polyether group-containing organic groups and epoxy group-containing organic groups; $R^4$ is a group selected from the class consisting of a hydrogen atom, the same monovalent hydrocarbon groups as $R^1$, the same monovalent organic functional groups as $R^2$ or $R^3$, and a hydroxyl group; and l is a positive integer so as to enable the organopolysiloxane to have a viscosity of from 50 to 500,000 cs at 25° C.

Further, it is advantageous to the organopolysiloxane used in the present invention that the molecular chain ends thereof are blocked by trimethylsilyl groups and, from the viewpoints of easy synthesis and high heat resistance and electric insulation of the oil obtained, the foregoing groups $R^1$ to $R^3$ are groups selected from among alkyl groups, such as methyl and ethyl groups, aryl groups, such as phenyl and tolyl groups, and groups formed by substituting hydroxyl group(s) for a part of hydrogen atoms attached to carbon groups present in those groups. As for the groups $R^1$ to $R^3$, methyl, phenyl and an alkyl group having 6 to 14 carbon atoms are preferred in particular.

The organopolysiloxane oil as mentioned above can be produced in accordance with known methods. For instance, a dimethylpolysiloxane oil can be produced by subjecting a low molecular cyclic siloxane, such as octamethylcyclotetrasiloxane or decamethylcyclopentasiloxane, to a ring-opening reaction in the presence of an acid catalyst, such as sulfuric acid, chlorosulfinic acid, nitric acid, phosphoric acid, activated clay, acid clay or trifluoroacetic acid, or an alkaline catalyst, such as potassium hydroxide, sodium hydroxide, rubidium hydroxide, cesium hydroxide, potassium oxide, potassium acetate or calcium silanolate, and then polymerizing the reaction product.

At the stage of polymerization in the foregoing method, the polymerization degree is required to be controlled for obtaining a dimethylpolysiloxane oil having the intended viscosity, and the control thereof can be achieved by properly adding a low molecular weight siloxane having a terminal blocking group, such as hexamethyldisiloxane, octamethyltrisiloxane or decamethyltetrasiloxane, at the time of polymerization.

As for the production of organopolysiloxanes having carbon functional groups, on the other hand, an amino group-containing organopolysiloxane can be produced by the dealcoholating condensation reaction between an organopolysiloxane having at least one silanol group and an amino group-containing alkoxysilane, and an epoxy group- or polyether group-containing organopolysiloxane can be produced by the addition reaction of a compound having both epoxy or polyether group and an unsaturated group, such as vinyl group, with an organohydrogenpolysiloxane, which has a hydrogen-attached silicon atom, in the presence of a platinum catalyst.

However, the organopolysiloxane oils produced in accordance with the foregoing methods generally contain low molecular weight siloxanes having at most 12 siloxane units in a proportion of around 10%, because they are obtained as equilibrated mixtures of polysiloxanes various in their polymerization degrees which are produced with the progress of polymerization.

After the production using the foregoing methods, therefore, the products obtained generally undergo a stripping treatment at a temperature of 120–250° C. under a reduced pressure to remove the low molecular weight siloxanes therefrom. Even after the stripping treatment, however, the low molecular weight siloxanes still remain in a quantity of 500–2,000 ppm. These low molecular weight siloxanes have a strong adsorbing power, compared with nonpolar combustible gases, so that their vapors are adsorbed strongly by various electrical contact parts and so on.

The low molecular weight siloxanes adsorbed to electrical contact parts are converted into $SiO_2 \cdot nH_2O$ by undergoing oxidation, and further accumulated in the form of $SiO_2$ on the surface of the contact parts to cause a contact trouble. Therefore, the presence of low molecular weight siloxanes is already known to be undesirable.

In addition, it is also known that such a trouble can be prevented by reducing each of the contents of low molecular weight siloxanes having no more than 12 siloxane units to at most 50 ppm.

The removal of the foregoing low molecular weight siloxanes to such an extent as to enable the prevention of the aforementioned trouble can be effected by subjecting an organopolysiloxane oil produced in accordance with a conventional method to a stripping treatment in an atmosphere of dried nitrogen gas which is carried out at a high temperature of 150–300° C. under a reduced pressure of 50 mmHg or below, or by extracting the low molecular weight siloxanes contained in an organopolysiloxane oil obtained by a conventional method with an alcohol or ketone solvent. More specifically, each of the contents of low molecular weight siloxanes in the organopolysiloxane oil produced by a conventional method can be reduced to less than 50 ppm by carrying out the treatment as mentioned above, and the total content of the low molecular weight siloxanes having from 2 to 12 siloxane units can be reduced to less than 500 ppm.

Further, $R^1$ as a monovalent substituted hydrocarbon group in the foregoing formula (I) may be a monovalent organic group having the hindered phenol structure described in Japanese Tokko Hei 3-131692 from the viewpoint of heightening heat resistance.

As examples of an organopolysiloxane having the aforementioned group as $R^1$, mention may be made of the compounds represented by the following formula (II), but these compounds should not be construed as limiting on the scope of the present invention.

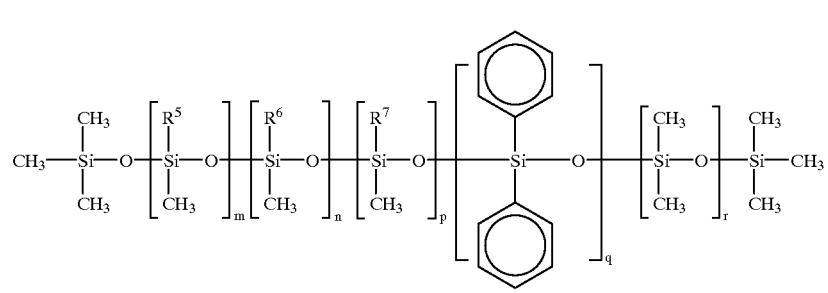

In the above formula, $R^5$ is $—C_4H_9$, $—C_6H_{13}$, $—C_8H_{17}$, $—C_{10}H_{21}$, $—C_{12}H_{25}$, $—C_{15}H_{31}$ or $—C_{18}H_{37}$; $R^6$ is $—(CH_2)_s—Q$, wherein s is an integer of 1 to 6 and Q is a group selected from among the monovalent organic groups having a hindered phenol structure represented by the following formula,

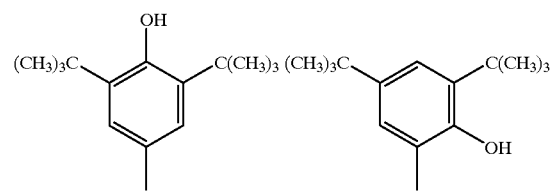

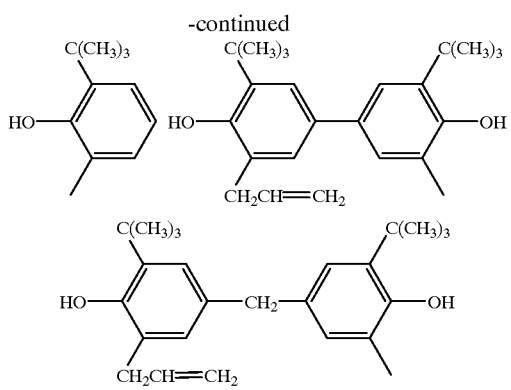

-continued $R^7$ is a 2-phenylethyl group or a 2-phenylpropyl group; and m, n, p, q and r are each a number satisfying the equations that $0 \leq m \leq 1,000$, $0 \leq n \leq 100$, $0 \leq p \leq 1,000$, $0 \leq q \leq 1,000$, $0 \leq r \leq 2,000$ and $5 \leq m+n+p+q+r \leq 2,000$.

With respect to the viscosity of the liquid silicone used in the present invention, as mentioned hereinbefore, the range of 50 to 500,000 cs, particularly 100 to 100,000 cs, at 25° C. is appropriate from the viewpoint of ensuring the consistency, dispensation suitability and thermal conductivity required for silicone grease.

The aluminum nitride powder used as a filler for giving a thermal conductivity to the present silicone composition is a nitride powder of the kind which consists of Group III and Group V elements and generally has a hexagonal or wurtzite crystal structure, and has a white or grayish white appearance. And the particles constituting the powder have a polygonal or spherical shape, although their shape depends on the preparation method thereof.

Such an aluminum nitride powder as described above can be produced by a direct nitriding method wherein a metallic aluminum powder is reacted directly with nitrogen or ammonia, an alumina reducing method wherein a mixed powder of alumina and carbon is heated in an atmosphere of nitrogen or ammonia to carry out the reduction and the nitriding at the same time, a method of reacting an aluminum vapor directly with nitrogen, or a method of carrying out the pyrolysis of $AlCl_3 \cdot NH_3$.

In addition, the aluminum nitride powder used in the present invention may be high purity aluminum nitride ceramic. The high purity aluminum nitride ceramic can be prepared by using as a raw powder an aluminum nitride powder produced by any of the aforementioned methods and sintering the raw powder. In order to make sintered aluminum nitride of high purity, it is required for the aluminum nitride powder as a raw material to be a fine powder having high purity, a uniform primary particle size of the order of 0.5 μm and liability to sintering.

Although the characteristics of an aluminum nitride powder, such as the chemical composition (impurities), the shape of particles and the particle size distribution, are dependent on the preparation method, the aluminum nitride powder used in the present invention may be an aluminum nitride powder prepared by any of the methods as described above, or a mixture of aluminum nitride powders prepared using different methods respectively.

The thus obtained aluminum nitride powder is a very hard material, and has an excellent thermal conductivity, electric insulation and mechanical strength.

The aluminum nitride powders having their average particle sizes in a wide range of 0.5 to 5 μm can be used in the present invention. In view of the dispersibility in a liquid silicone, however, it is desirable for the powder used in the present invention to have an average particle sizes in the range of 1 to 4 μm, particularly 2 to 4 μm.

When the average particle size of an aluminum nitride powder used is smaller than 0.5 μm, the powder is undesirable because of its too great viscosity-increasing effect. In other words, the grease obtained using such a powder has low consistency (or poor in dispensation suitability). When the average particle size is larger than 5 μm, on the other hand, the thermally conductive material obtained is poor in uniformity and stability and, what is worse, the base oil separates therefrom to a considerable extent (namely, the material obtained is high in oil-separation degree). Therefore, it is a matter of course that good grease cannot be obtained in the foregoing cases.

Further, it is desirable for such a powder to have a specific surface area of from 1 to 5 m²/g. In particular, the specific surface area ranging from 2 to 4 m²/g is preferred from the viewpoint of compatibility with a liquid silicone.

In general, aluminum nitride is very hard, and the Mohs' hardness thereof is within the range of 7 to 9. Any aluminum nitride can be used in the present invention as far as the Mohs' hardness thereof is in the foregoing range, but the aluminum nitride having Mohs' hardness of from 8 to 9 is used to advantage.

The thermal conductivity of aluminum nitride is $7.7 \times 10^{-1}$ cal/cm·sec·° C. in theory, but the actually measured value is lower than the theoretical value, specifically $6.0 \times 10^{-1}$ cal/cm·sec·° C. or below, because the aluminum nitride powder obtained in practice is more or less contaminated with impurities and contains voids and bubbles. It is desirable for the aluminum nitride powder used in the present invention to have a thermal conductivity of at least $1.5 \times 10^{-1}$ cal/cm·sec·° C., particularly preferably at least $2.4 \times 10^{-1}$ cal/cm·sec·° C., at room temperature. When the thermal conductivity of an aluminum nitride powder used is below $1.5 \times 10^{-1}$ cal/cm·sec·° C., the thermal conductivity of the grease or the sheet obtained cannot reach such a high value as to be aimed at by the present invention.

Specific examples of aluminum nitride which can be used in the present invention include US, UF and UM, commercial names, produced by Toyo Aluminum Co., Ltd., XUS-55548, commercial name, produced by Dow Chemical Co., Ltd., H-grade and F-grade, commercial names, produced by K. K. Tokuyama, FA and ES-10, commercial names, produced by Nippon Light Metal Co., Ltd., and A-100WR, A-100 and AG-SD, commercial names, produced by Advanced Refractory Technologies Inc.

The zinc oxide used in the present invention is generally called Zinc White, and it is a white powder having a hexagonal or wurtzite crystal structure. Such a zinc oxide powder can be prepared using known methods, including an indirect method wherein the zinc vapor generally produced by heating metallic zinc to 1,000° C. is oxidized with hot air, and a direct method wherein the zinc oxide obtained by roasting zinc ore is reduced by coal and the zinc vapor produced is oxidized with hot air, or the slag obtained by the leaching of zinc ore with sulfuric acid is admixed with coke, heated in an electric furnace and the zinc vapor produced thereby is oxidized with hot air.

The zinc oxide produced using any of the foregoing methods is cooled by passing through an air condenser equipped with a blower, and fractionated according to the grain size. As another production method of zinc oxide, there is known a wet method in which a zinc salt solution is admixed with an alkali carbonate solution to precipitate zinc hydroxycarbonate and the zinc hydroxycarbonate obtained is roasted.

The thus obtained zinc oxide powders are defined in accordance with the Japanese Industrial Standards, JIS K1410 and K5102, or American standards, ASTM-D79.

In the present invention, the zinc oxide powders produced by any methods, including the foregoing methods, can be used alone, or a mixture of zinc oxide powders produced by different methods may be used.

The zinc oxide powder is used not only as a vulcanization accelerator for rubber but also in the fields of coating color, ceramics, enameled ware, glass, ferrite, cosmetics and medicines. Further, it is known to use a zinc oxide powder as a thermal conductivity providing filler in a thermally conductive grease [Japanese Tokkai Sho 51-55870, Sho 54-116055, Sho 55-45770, Sho 56-28264, Sho 61-157587, Hei 2-212556 (U.S. Pat. No. 5,221,339), Hei 3-162493 (U.S. Pat. No. 5,100,568) and Hei 4-202496).

The average particle size of a zinc oxide powder which can be used in the present invention is in a wide range of 0.2 to 5 $\mu$m. In view of the dispersibility in a liquid silicone and the relation with the aluminum nitride powder, however, it is desirable for the zinc oxide powder used in the present invention to have an average particle sizes in the range of 0.3 to 4 $\mu$m, particularly 0.3 to 3 $\mu$m. By adjusting the average size to the foregoing range, the oil-separation degree of the thermally conductive material obtained can be controlled to 0.01% or below. Further, it is desirable that the Mohs' hardness of the thermally conductive material obtained be adjusted to from 4 to 5.

The thermal conductivity of a thermally conductive material according to the present invention depends on the ratio of a thermal conductivity providing filler to a liquid silicone.

In order to achieve a high thermal conductivity aimed at by the present invention, it is necessary to increase the filling rates of fillers, especially that of an aluminum nitride powder. Further, the shape and the particle size of filler particles have a very important role in the attainment of a high filling rate without attended by deterioration in grease characteristics. Apart from a thermally conductive sheet, an increase in filling rate tends to cause a decrease in consistency of the grease obtained, thereby spoiling the dispensation suitability of the grease.

The term "dispensation suitability" as used above indicates the ease of the work for coating a grease on a substrate. When the grease has an inferior dispensation suitability, the ease of the coating work using a cylinder-form tool equipped with a grease extruding means is reduced and it becomes difficult to form a thin coating of the grease on a substrate. In the case of a thermally conductive material as grease, therefore, it is desirable from the viewpoint of achieving a high filling rate while securing a dispensation suitability that the shape of the filler particles be as close to a sphere as possible.

However, an aluminum nitride powder consists of square- or flake-shaped particles rather than sphere-shaped particles due to the production process and crystal structure thereof, so that it tends to increase the viscosity of a thermally conductive material with a rise in filling rate thereof in the material. In other words, the rise in filling rate causes an increase in the viscosity, or a drop in consistency, of the thermally conductive material to impair the dispensation suitability required for a thermally conductive grease.

On the other hand, the thermal conductivity of zinc oxide is 6.0×10$^{-2}$ cal/cm·sec·° C. in theory and lower than that of aluminum nitride, namely 7.7×10$^{-1}$ cal/cm·sec·° C., so that it has hardly ever been used in the fields where high thermal conductivity is needed. As for the hardness, however, zinc oxide is softer than aluminum nitride. Therefore, when the zinc oxide powder is used in combination with aluminum nitride powder, a soft zinc oxide particle can be arranged among hard aluminum nitride particles to function so as to confer a mobility on the close-packed structure to enable an improvement in dispensation suitability.

The thermal conductivity of zinc oxide is, as described above, 6.0×10$^{-2}$ cal/cm·sec·° C. in theory, but the zinc oxide powders obtained in practice have heat conductivities lower than the theoretical value, because they are more or less contaminated with impurities and contain voids and bubbles in particles thereof. It is desirable for the zinc oxide powder used in the present invention to have a thermal conductivity of at least 1.2×10$^{-2}$ cal/cm·sec·° C.

As for the mixing ratio between zinc oxide and aluminum nitride powders used in the present invention, it is desirable that the proportion of the zinc oxide powder be from 5 to 50 weight %, particularly from 10 to 30 weight %, to the total powders. When the zinc oxide powder is mixed in a proportion lower than 5 weight %, it cannot fill up sufficiently the gaps among hard aluminum nitride particles to fail in not only efficiently improving the thermal conductivity but also imparting satisfactory dispensation suitability to a thermally conductive material intended for grease.

When the zinc oxide powder is mixed in a proportion higher than 50 weight %, on the other hand, it becomes difficult to produce an improvement in thermal conductivity, because the thermal conductivity of zinc oxide powder (6.0×10$^{-2}$ cal/cm·sec·° C. in theory) is almost one order in magnitude lower than that of aluminum nitride powder (7.7×10$^{-1}$ cal/cm·sec·° C.).

In accordance with the present invention, aluminum nitride and zinc oxide powders are mixed in a proper proportion. As a result of it, these fillers can be most appropriately dispersed into an organopolysiloxane to enable the grease to have a proper consistency and suffer no deterioration in dispensation suitability. Thus, a thermally conductive grease having a thermal conductivity on a very high level, namely at least 6.0×10$^{-3}$ cal/cm·sec·° C., compared with conventional ones, can be obtained. Additionally, it is desirable for general thermally conductive materials used in electronic devices which generate heat during operation to have a thermal conductivity of at least 8.0×10$^{-3}$ cal/cm·sec·° C.

The filler of the present invention, namely the mixture of an aluminum nitride powder with a zinc oxide powder, is required to be blended with a liquid silicone as the first component in a proportion of from 500 to 1,000 parts by weight, preferably from 800 to 1,000 parts by weight, per 100 parts by weight of the liquid silicone. When the proportion is lower than 500 parts by weight, the thermal conductivity attained is practically equal to those of conventional thermally conductive materials; while, when the proportion is higher than 1,000 parts by weight, the thermally conductive material obtained can be high in thermal conductivity but it is too hard and poor in dispensation suitability to be used as grease, so that it isn't for grease.

The present silicone composition may further comprise various additives, such as a thixotropy providing agent, an antioxidant, metallic powders, metallic fibers, a flame retardant, heat-resistant additives, pigments, a blowing agent, a cross-linking agent, a curing agent, a vulcanizing agent and a mold-releasing agent, if desired. Specific examples of additives which can be generally used include reinforcing fillers, such as aerosol silica, precipitated silica, diatomaceous earth and non-conductive carbon black, aluminum oxide, mica, clay, zinc carbonate, glass beads, polydimethylsiloxane, alkenyl group-containing polysiloxanes, and polymethylsilsesquioxane. These additives can be properly chosen according to the necessity or usefulness, and mixed under heat or reduced pressure. In kneading the present components with those additives, a closed kneader, a two-rod roll, a three-rod roll, a colloid mill or the like can be used to disperse them homogeneously.

The present thermally conductive material can be prepared in the following manner: At least the foregoing liquid silicone, aluminum nitride powder and zinc oxide powder are weighed out in proper amounts, admixed with additives, such as an antioxidant, if needed, and then kneaded together using a planetary mixer or the like. In view of dispensation suitability, it is desirable for the grease to have the consistency of from 200 to 400, particularly from 250 to 350.

In applying the grease prepared in the foregoing manner to an electronic apparatus which generates heat during the operation, it is desirable to use an injector-like coating device which is fitted up with a means to push the grease charged therein towards the outlet. In particular, the application of grease to an electronic apparatus by users thereof becomes easy if the foregoing coating device is in advance charged with the present grease.

The thus obtained thermally conductive material relating to the present invention has satisfactorily high thermal conductivity because the gaps among aluminum nitride particles as a heat conducting agent are filled with zinc oxide particles, and further improved dispensation suitability due to the zinc oxide particles incorporated therein; as a result, it is easy for the present thermally conductive material to control an oil separation degree to 0.01% or below and The present invention will now be illustrated in greater detail by reference to the following examples. However, the invention should not be construed as being limited to these examples. Additionally, all "pars" and "%" in the following examples and comparative examples are by weight unless otherwise noted.

EXAMPLES 1–10

The organopolysiloxanes represented by the following general formula (III) having the viscosities set forth in Table 1 respectively were used as base oil in the same amount of 100 parts.

TABLE 1

| Example No. | Comparative Example No. | Symbol representing Base Oil | Viscosity at 25° C. (cs) | Average Polymerization Degree | | | |
|---|---|---|---|---|---|---|---|
| | | | | m' | n' | q' | r' |
| 1,4,5 | 3,4 | $A_1$ | 450 | 20 | 0 | 0 | 25 |
| 2 | 1 | $A_2$ | 100 | 8 | 0 | 0 | 10 |
| 3 | 2,5 | $A_3$ | 1,000 | 79 | 1 | 0 | 100 |
| 6 | 6 | $B_1$ | 500 | 0 | 0 | 0 | 240 |
| 7 | | $B_2$ | 100 | 0 | 0 | 0 | 76 |
| 8 | | $B_2$ | 100,000 | 0 | 0 | 0 | 1,500 |
| | 7 | $B_4$ | 10,000 | 0 | 0 | 0 | 800 |
| 9, 10 | | $C_1$ | 400 | 0 | 0 | 3 | 9 |
| | 8 | $C_2$ | 500 | 0 | 0 | 4 | 12 |

The aluminum nitride powders and the zinc oxide powders, which had their individual average particle sizes as set forth in Table 2, were each weighed in the amounts set forth in Table 2, mixed so as to be shown in Table 2 and added to the foregoing base oils respectively. Then, each set of the aforesaid three components were thoroughly mixed for 20 minutes by means of a planetary mixer, and further subjected to a kneading process for three times by means of a three-rod roll. Thus, the thermally conductive silicone compositions according to the present invention were prepared.

The thus prepared compositions were each examined for consistency and oil separation degree in accordance with JIS-K-2220 with the intention of using them as heat sensitive grease.

The term "consistency" as used herein is a measure of the hardness of petroleum products, such as grease and petrolatum, that is measured with a penetrometer equipped with a cone having the specified shape, dimensions and mass. More specifically, such a cone is made to penetrate vertically for a definite time (usually 5 seconds) into a sample kept at a definite temperature (usually 25° C.), and the depth the cone reaches is measured on a scale of 0.1 mm. Therein, the consistency is defined as "1" when the penetration depth is 0.1 mm. Accordingly, the consistency of from 200 to 400 specified by the present application (see, e.g., Table 2) refers to the penetration depth of from 20 mm to 40 mm.

Further, the heat conductivities of the prepared compositions were measured with a hot-wire instrument for measuring thermal conductivity, Model TCW-1000, made by Shinku Riko Co., Ltd. The results obtained for consistency,

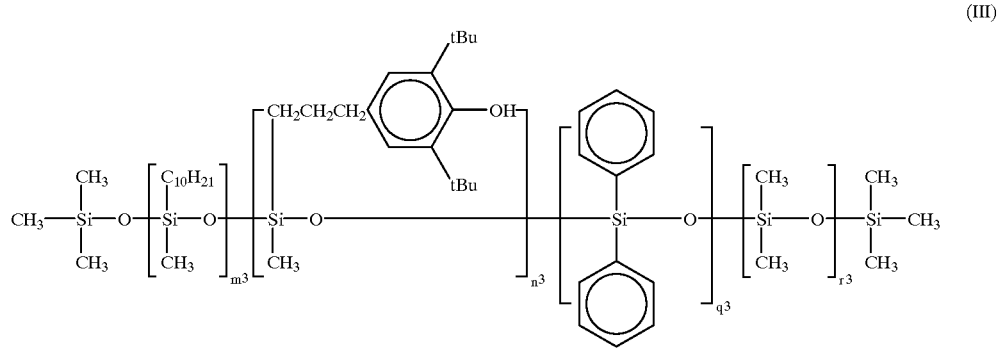

(III)

degree of oil separation and heat conductivity are shown in Table 2.

namely 0–0.01%, under the condition of 150° C./24 hrs. and a consistency in the range of 200 to 400. in other words,

TABLE 2

| | Base Oil | | Filler(AlN + ZnO) | | | | Consistency | | Degree of | Thermal |
| | | | Amount used* (parts | | Average particle ZnO/ | Average particle size of | oil | | Separation | |
| | species | viscosity at 25° C.(cs) | by weight) | (AlN + ZnO) (by weight) | AlN ($\mu$m) | ZnO ($\mu$m) | before kneading | after kneading | (%) 150° C./24 hrs. | Conductivity Cal/cm · sec · ° C. |
|---|---|---|---|---|---|---|---|---|---|---|
| Example 1 | $A_1$ | 450 | 900 | 0.30 | 1.2 | 0.3 | 310 | 290 | 0 | $8.85 \times 10^{-3}$ |
| Example 2 | $A_2$ | 100 | 900 | 0.22 | 2.0 | 0.5 | 290 | 275 | 0 | $8.90 \times 10^{-3}$ |
| Example 3 | $A_3$ | 1,000 | 900 | 0.11 | 5.0 | 0.2 | 320 | 315 | 0.01 | $8.95 \times 10^{-3}$ |
| Example 4 | $A_1$ | 450 | 800 | 0.20 | 11.0 | 0.5 | 220 | 230 | 3.0 | $6.10 \times 10^{-3}$ |
| Example 5 | $A_1$ | 450 | 900 | 0.20 | 2.0 | 0.05 | 125 | 135 | 0.0 | $6.50 \times 10^{-3}$ |
| Example 6 | $B_1$ | 500 | 650 | 0.29 | 0.5 | 5.0 | 305 | 310 | 0 | $8.88 \times 10^{-3}$ |
| Example 7 | $B_2$ | 100 | 550 | 0.09 | 0.9 | 3.0 | 320 | 330 | 0 | $7.05 \times 10^{-3}$ |
| Example 8 | $B_3$ | 100,000 | 600 | 0.17 | 1.0 | 2.0 | 305 | 315 | 0 | $7.10 \times 10^{-3}$ |
| Example 9 | $C_1$ | 400 | 900 | 0.06 | 1.5 | 0.4 | 265 | 260 | 0 | $8.95 \times 10^{-3}$ |
| Example 10 | $C_1$ | 500 | 900 | 0.44 | 1.8 | 1.0 | 330 | 335 | 0 | $6.70 \times 10^{-3}$ |

*per 100 parts by weight of base oil

COMPARATIVE EXAMPLES 1–8

Thermally conductive silicone compositions were prepared in the same manner as in the aforementioned Examples, except that the aluminum nitride and zinc oxide powders used as filler in each composition were changed in the total amount used and the ratio between their respective amounts so as to be shown in Table 3.

The compositions thus prepared were each examined for consistency, oil separation degree and thermal conductivity in the same ways as in Examples, respectively. The results obtained are shown in Table 3, too.

these compositions had most appropriate properties for grease, and the dispensation suitabilities thereof were very satisfactory.

Additionally, the compositions prepared in Comparative Examples had the following drawbacks:

The composition prepared in Comparative Example 1 was insufficient in thermal conductivity, because the filler free from a zinc oxide powder was used therein.

The composition prepared in Comparative Example 2 was inferior in thermal conductivity, because a zinc oxide powder alone was used as filler.

TABLE 3

| | Base Oil | | Filler(AlN + ZnO) | | | | Consistency | | Degree of | Thermal |
| | | | Amount used* (parts | | Average particle ZnO/ | Average particle size of | oil | | Separation | |
| | species | viscosity at 25° C.(cs) | by weight) | (AlN + ZnO) (by weight) | AlN ($\mu$m) | ZnO ($\mu$m) | before kneading | after kneading | (%) 150° C./24 hrs. | Conductivity Cal/cm · sec · ° C. |
|---|---|---|---|---|---|---|---|---|---|---|
| Example 1 | $A_1$ | 450 | 900 | 0.30 | 1.2 | 0.3 | 310 | 290 | 0 | $5.50 \times 10^{-3}$ |
| Compar. Ex. 2 | $A_3$ | 1,000 | 550 | 1.00 | — | 0.2 | 333 | 350 | 0.0 | $2.50 \times 10^{-3}$ |
| Compar. Ex. 3 | $A_1$ | 450 | 630 + 270 | 0 | 11.0 0.1 | — | 110 | 125 | 2.0 | $7.50 \times 10^{-3}$ |
| Compar. Ex. 4 | $A_1$ | 450 | 750 | 0.04 | 2.5 | 0.5 | 320 | 340 | 2.3 | $5.10 \times 10^{-3}$ |
| Compar. Ex. 5 | $A_3$ | 1,000 | 1,100 | 0.25 | 2.0 | 0.3 | 73 | 85 | 0.5 | $6.80 \times 10^{-3}$ |
| Compar. Ex. 6 | $B_1$ | 500 | 400 | 0.20 | 2.0 | 0.5 | 330 | 345 | 0.1 | $5.40 \times 10^{-3}$ |
| Compar. Ex. 7 | $B_4$ | 10,000 | 900 | 0.55 | 2.0 | 3.0 | 230 | 238 | 0.4 | $5.00 \times 10^{-3}$ |
| Compar. Ex. 8 | $C_2$ | 500 | 750 | 0.55 | 1.5 | 1.0 | 180 | 195 | 0.9 | $2.10 \times 10^{-3}$ |

*per 100 parts by weight of base oil

As can be seen from the data shown in Tables 2 and 3, the thermally conductive silicone compositions prepared in Examples had their thermal conductivity in the range of 6.0–8.95×10$^{-3}$ cal/cm·sec·° C., which shows that the thermally conductive silicone compositions according to the present invention had a marked improvement in thermal conductivity over hitherto known compositions, specifically those prepared in Comparative Examples. In particular, each of the compositions prepared in Examples 1–3 and Examples 6–10 had a very low degree of oil separation, The composition prepared in Comparative Example 3 corresponds to the composition according to Japanese Tokkai Hei 3-14873, wherein aluminum nitride powders differing in particle size were used, had a satisfactory thermal conductivity, but it was too hard to be used in practice.

The composition prepared in Comparative Example 4 was insufficient in thermal conductivity and had a high degree of oil separation, because the ratio of zinc oxide to the total filler was low.

The composition prepared in Comparative Example 5 was too hard to be used in practice, because the total amount of the filler used was too large.

The composition prepared in Comparative Example 6 was insufficient in thermal conductivity, because the total amount of the filler used was too small.

The composition prepared in Comparative Example 7 was insufficient in thermal conductivity, because the ratio of zinc oxide to the total filler was too high.

The composition prepared in Comparative Example 8 was inferior in thermal conductivity, because the ratio of zinc oxide to the total filler was too high.

What is claimed is:

1. A thermally conductive silicone composition comprising a liquid silicone and a thermally conductive filler, said thermally conductive filler comprising an aluminum nitride powder and a zinc oxide powder, wherein the total amount of said powders are from 500 to 1,000 parts by weight per 100 parts by weight of the liquid silicone and the ratio of the zinc oxide powder to the sum total of the aluminum nitride powder and the zinc oxide powder is from 0.05 to 0.5 by weight.

2. A thermally conductive silicone composition according to claim 1, wherein said liquid silicone is an organopolysiloxane represented by formula $R_a SiO_{(4-a)/2}$ wherein R groups are the same or different monovalent organic groups and a is a number of 1.8–2.3.

3. A thermally conductive silicone composition according to claim 1, wherein said liquid silicone has a viscosity of from 50 to 500,000 cs at 25° C.

4. A thermally conductive silicone composition according to claim 2, wherein said R groups are groups selected from the class consisting of a methyl group, a phenyl group and alkyl groups having 6 to 14 carbon atoms.

5. A thermally conductive silicone composition according to claim 2, wherein the organopolysiloxane is an organopolysiloxane of formula,

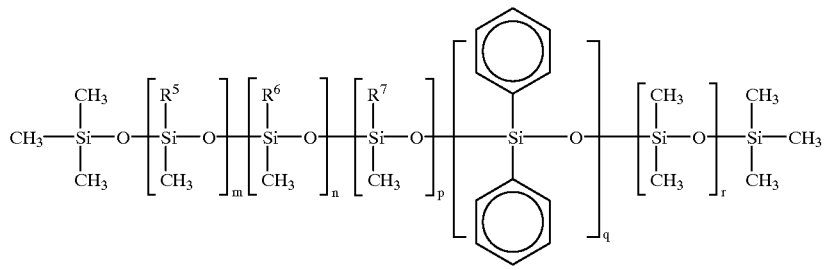

wherein $R^5$ is $-C_4H_9$, $-C_6H_{13}$, $-C_8H_{17}$, $-C_{10}H_{21}$, $-C_{12}H_{25}$, $-C_{15}H_{31}$ or $-C_{18}H_{37}$; $R^6$ is $-(CH_2)_s-Q$, s is an integer of 1 to 6 and Q is a monovalent organic groups having a hindered phenol structure; $R^7$ is a 2-phenylethyl group or a 2-phenylpropyl group; and m, n, p, q and r are each a number satisfying the equations that $0 \leq m \leq 1,000$, $0 \leq n \leq 100$, $0 \leq p \leq 1,000$, $0 \leq q \leq 1,000$, $0 \leq r \leq 2,000$ and $5 \leq m+n+p+q+r \leq 2,000$.

6. A thermally conductive silicone composition according to claim 1, wherein said aluminum nitride powder has an average particle size of from 0.5 to 5 μm.

7. A thermally conductive silicone composition according to claim 1, wherein said zinc oxide powder has an average particle size of from 0.2 to 5 μm.

8. A thermally conductive material comprising a liquid silicone and a thermally conductive filler, said thermally conductive filler comprising an aluminum nitride powder and a zinc oxide powder, and said material having a thermal conductivity of at least $6.0 \times 10^{-3}$ cal/cm·sec·° C. and comprising said powders in a total amount of from 500 to 1,000 parts by weight per 100 parts by weight of the liquid silicone.

9. A thermally conductive material according to claim 8, wherein the ratio of the zinc oxide powder to the sum total of the aluminum nitride powder and the zinc oxide powder is from 0.05 to 0.5 by weight.

10. A thermally conductive silicone grease comprising a liquid silicone and a thermally conductive filler: said thermally conductive filler comprising an aluminum nitride powder and a zinc oxide powder; and said grease having a thermal conductivity of at least $6.0 \times 10^{-3}$ cal/cm·sec·° C., a consistency of from 200 to 400, measured in accordance with JIS-K-2220, and comprising said powders in a total amount of from 500 to 1,000 parts by weight per 100 parts by weight of the liquid silicone.

11. A thermally conductive silicone grease according to claim 10, wherein the ratio of the zinc oxide powder to the sum total of the aluminum nitride powder and the zinc oxide powder is from 0.05 to 0.5 by weight.

12. A thermally conductive silicone grease according to claim 10, wherein said aluminum nitride powder has an average particle size of from 0.5 to 5 μm.

13. A thermally conductive silicone grease according to claim 10, wherein said zinc oxide powder has an average particle size of from 0.2 to 5 μm.

14. A thermally conductive silicone grease according to claim 10, said grease being charged in an injector coating device equipped with a means to push the grease towards the outlet.

15. A thermally conductive silicone grease according to claim 10, wherein said liquid silicone is an organopolysiloxane represented by formula $R_a SiO_{(4-a)/2}$ wherein R groups are the same or different monovalent organic groups and a is a number of 1.8–2.3.

16. A thermally conductive silicone grease according to claim 15, wherein the organopolysiloxane is an organopolysiloxane of formula,

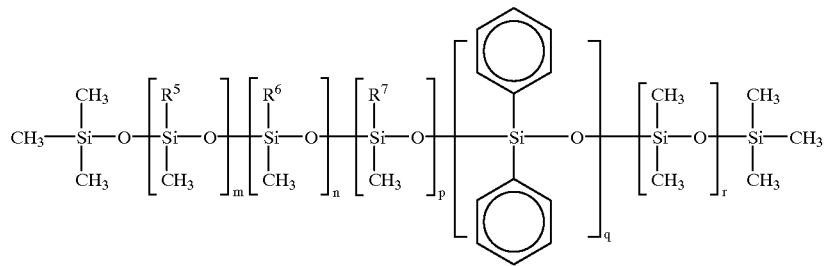

wherein $R^5$ is —$C_4H_9$, —$C_6H_{13}$, —$C_8H_{17}$, —$C_{10}H_{21}$, —$C_{12}H_{25}$, —$C_{15}H_{31}$ or —$C_{18}H_{37}$; $R^6$ is —$(CH_2)_s$—Q, s is an integer of 1 to 6 and Q is a monovalent organic groups having a hindered phenol structure; $R^7$ is a 2-phenylethyl group or a 2-phenylpropyl group; and m, n, p, q and r are each a number satisfying the equations that $0 \leq m \leq 1,000$, $0 \leq n \leq 100$, $0 \leq p \leq 1,000$, $0 \leq q \leq 1,000$, $0 \leq r \leq 2,000$ and $5 \leq m+n+p+q+r \leq 2,000$.

17. A composition according to claim 2, wherein a is a number from 1.9–2.1.

18. A composition according to claim 1, wherein said liquid silicone has a viscosity of from 100 to 100,000 cs at 25° C.

19. A composition according to claim 6, wherein said aluminum nitride powder has an average particle size of from 2–4 μm.

20. A composition according to claim 7, wherein said zinc oxide powder has an average particle size of from 0.3–3 μm.

* * * * *